(12) United States Patent
Tanaka et al.

(10) Patent No.: US 8,708,586 B2
(45) Date of Patent: *Apr. 29, 2014

(54) CAMERA MODULE AND METHOD OF MANUFACTURING SAME

(71) Applicant: Fujitsu Component Limited, Tokyo (JP)

(72) Inventors: Tetsugaku Tanaka, Tokyo (JP); Koki Sato, Tokyo (JP); Mitsuru Kobayashi, Tokyo (JP)

(73) Assignee: Fujitsu Component Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/678,717

(22) Filed: Nov. 16, 2012

(65) Prior Publication Data
US 2013/0156415 A1 Jun. 20, 2013

(30) Foreign Application Priority Data

Dec. 20, 2011 (JP) ................................. 2011-278927

(51) Int. Cl.
*G03B 17/00* (2006.01)
(52) U.S. Cl.
USPC ......................................... 396/529

(58) Field of Classification Search
USPC ........... 396/529, 533; 359/704, 827, 829, 830
See application file for complete search history.

(56) References Cited

U.S. PATENT DOCUMENTS

| 6,977,783 | B2 * | 12/2005 | Lung | 359/819 |
| 8,506,185 | B2 * | 8/2013 | Sato et al. | 396/529 |
| 2007/0182842 | A1 * | 8/2007 | Sonnenschein et al. | 348/340 |
| 2007/0223913 | A1 * | 9/2007 | Lee | 396/529 |
| 2011/0293264 | A1 * | 12/2011 | Sato et al. | 396/529 |
| 2013/0088637 | A1 * | 4/2013 | Duparre | 348/360 |

FOREIGN PATENT DOCUMENTS

JP 2011-043526 3/2011

* cited by examiner

*Primary Examiner* — Clayton E LaBalle
*Assistant Examiner* — Warren K Fenwick
(74) *Attorney, Agent, or Firm* — IPUSA, PLLC

(57) ABSTRACT

A camera module includes multiple terminals formed by performing press working on a metal plate; a holder formed with the terminals by insert molding, wherein the holder holds the terminals, a through hole is formed through the holder in a direction in which the terminals extend, and a screw part is formed on a sidewall of the through hole; a lens housed in the through hole by being screwed to the screw part; and a camera part attached to the holder on a rear side of the lens.

8 Claims, 6 Drawing Sheets

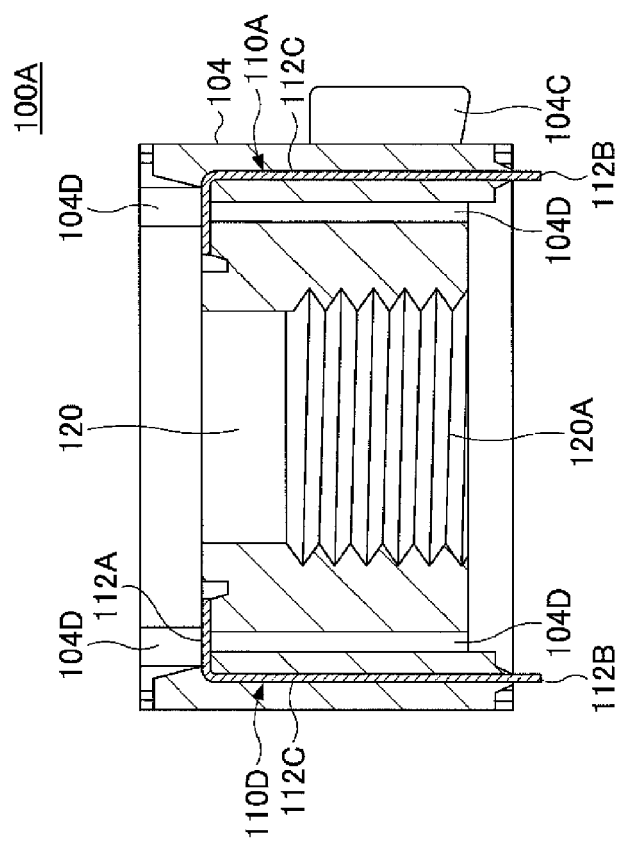
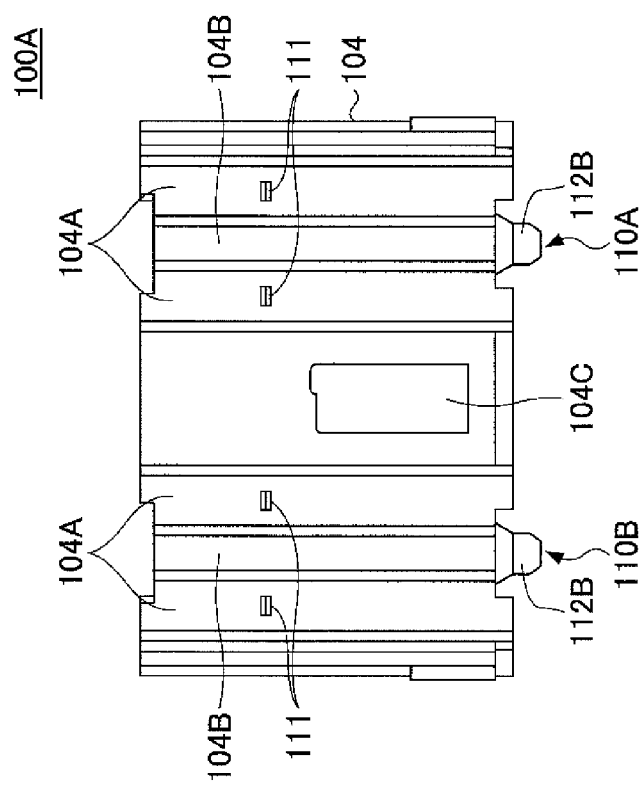

US 8,708,586 B2

CAMERA MODULE AND METHOD OF MANUFACTURING SAME

CROSS-REFERENCE TO RELATED APPLICATION

The present application is based upon and claims the benefit of priority of the prior Japanese Patent Application No. 2011-278927, filed on Dec. 20, 2011, the entire contents of which are incorporated herein by reference.

BACKGROUND OF THE INVENTION

1. Field of the Invention

The present invention relates to a camera and a method of manufacturing the same.

2. Description of the Related Art

There is a conventional lens module where a substantially columnar magnet fixed to an electromechanical transducer is caused to vibrate with vibrations generated in the electromechanical transducer so that a movable body in point contact at two points or in surface contact with the magnet is driven to slide using the vibration of the magnet as a driving force, thereby causing a lens holder to which the movable body is attached to move along the directions of the optical axis of an optical lens. (For example, see Japanese Laid-Open Patent Application No. 2011-043526.)

SUMMARY OF THE INVENTION

According to an aspect of the present invention, a camera module includes a plurality of terminals formed by performing press working on a metal plate; a holder formed with the terminals by insert molding, wherein the holder holds the terminals, a through hole is formed through the holder in a direction in which the terminals extend, and a screw part is formed on a sidewall of the through hole; a lens housed in the through hole by being screwed to the screw part; and a camera part attached to the holder on a rear side of the lens.

According to an aspect of the present invention, a method of manufacturing a camera module includes forming a pressed substrate including a plurality of sets of terminals by performing press working on a metal plate; forming a holder by performing insert molding on each of the sets of the terminals so that the holder holds the terminals, wherein said forming the holder includes forming a through hole through the holder in a direction in which the terminals extend and forming a screw part on a sidewall of the through hole; and performing singulation of the holder on a holder basis.

According to an aspect of the present invention, a camera module includes a plurality of metal terminals; a holder that is an insert-molded product including the terminals as inserts; a lens screwed into a through hole formed through the holder; and a camera part attached to the holder, wherein a light entrance surface of the camera part faces toward the lens.

BRIEF DESCRIPTION OF THE DRAWINGS

FIGS. 5A and 5B are diagrams illustrating the module according to an embodiment.

DETAILED DESCRIPTION OF THE PREFERRED EMBODIMENTS

A description is given, with reference to the accompanying drawings, of one or more embodiments of the present invention, where a camera module and a method of manufacturing the camera module according to an aspect of the present invention may be applied.

Figure 1:
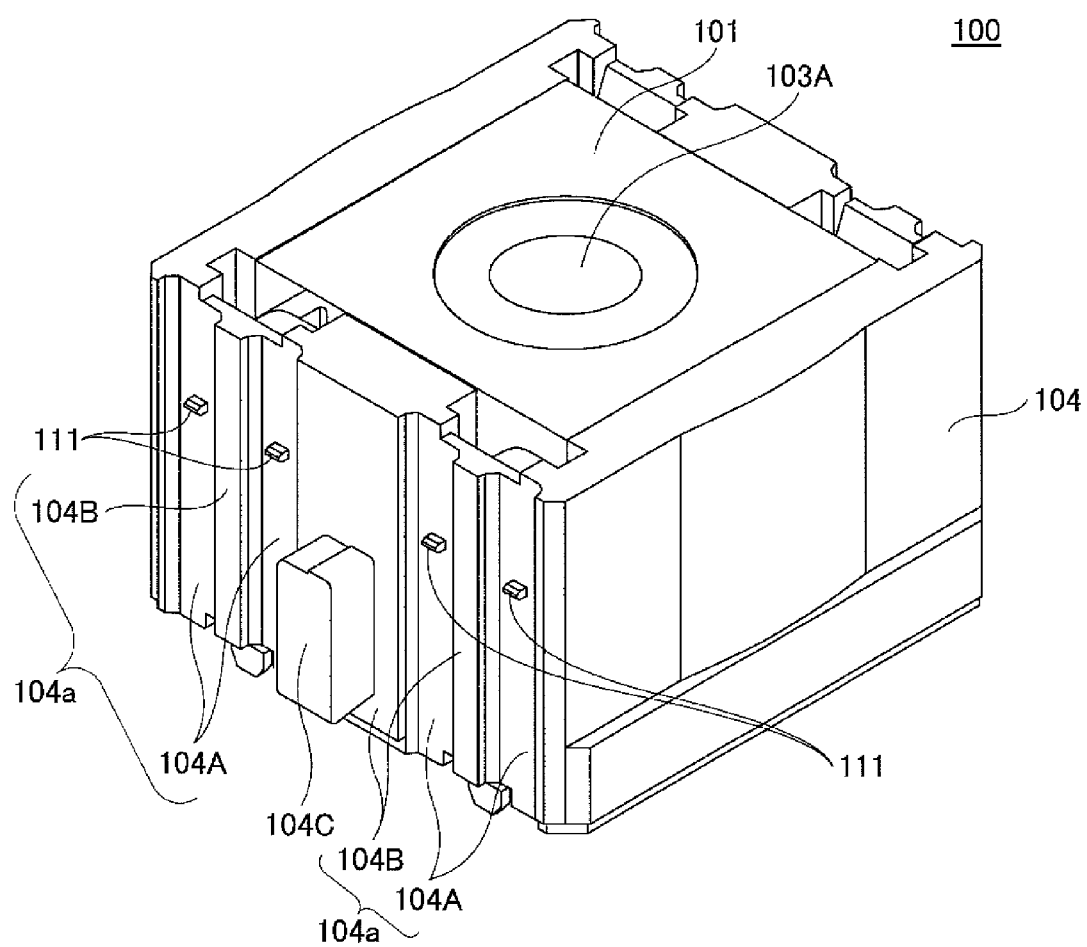
FIG. 1 is a perspective view of a camera module according to an embodiment.
Figure 2:
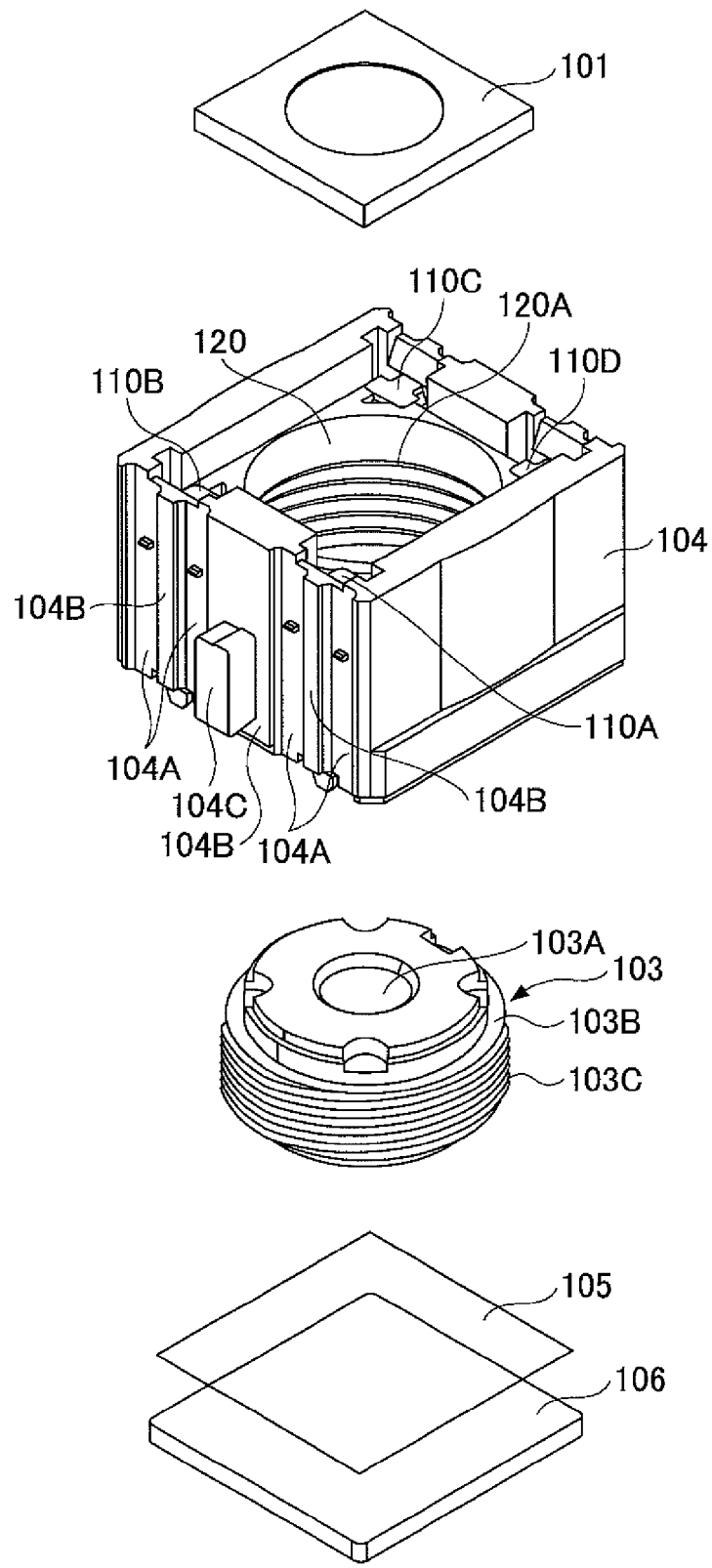
FIG. 2 is an exploded perspective view of the camera module illustrated in FIG. 1.

FIG. 1 is a perspective view of a camera module 100 according to an embodiment of the present invention. FIG. 2 is an exploded perspective view of the camera module 100 illustrated in FIG. 1.

Referring to FIG. 1 and FIG. 2, the camera module 100 includes an automatic focus part 101, a lens barrel 103, a holder 104, an infrared (IR) cut film 105, an image sensor 106, and terminals 110A, 110B, 110C, and 110D.

The automatic focus part 101 may be of a type that performs focusing the deformation of a piezoelectric element.

The lens barrel 103 is a barrel-shaped component that houses a lens 103A inside a housing 103B. The housing 103B of the lens barrel 103 is made of resin, and a screw part 103C is formed on an exterior side surface of the housing 103B. That is, for example, the housing 103B is threaded on its exterior circumferential surface.

The holder 104 is formed together with the terminals 110A through 110D by insert molding. That is, the holder 104 is an insert-molded product including the terminals 110A through 110D as inserts. The holder 104 is made of, for example, thermosetting resin. The terminals 110A through 110D extend downward (in a direction from the automatic focus part 101 to the image sensor 106) inside the holder 104. A wall part 104a of the holder 104 includes first wall parts 104A and second wall parts 104B. The first wall parts 104A are depressed relative to the second wall parts 104B. That is, the second wall parts 104B are projecting relative to the first wall parts 104A. The terminals 110A through 110D have respective cut parts 111 projecting on an exterior surface of the first wall parts 104A. The second wall parts 104B project more (in an outward direction) than the cut parts 111 relative to the exterior surface of the first wall parts 104A. Thus, the wall part 104a of the holder 104 is depressed around the cut parts 111.

The holder 104 includes a through hole 120 that houses the lens barrel 103. A screw part 120A is formed on an interior wall surface of the through hole 120. That is, for example, the holder 104 has an interior wall surface that defines the through hole 120, and the interior wall surface is threaded. The screw part 103C of the lens barrel 103 is screwed into the screw part 120A so that the lens barrel 103 is housed inside the through hole 120.

The IR cut film 105 is provided between the lens barrel 103 and the image sensor 106 on the rear side (on the bottom side in FIG. 2) of the lens barrel 103. For example, the IR cut film 105 is so provided on the image sensor 106 as to cover the light entrance surface (the upper surface in FIG. 2) of the image sensor 106.

Examples of the image sensor 106 include a charge coupled device (CCD) image sensor and a complementary metal oxide semiconductor (CMOS) image sensor. The number of pixels of the image sensor 106 may be so determined as to obtain a desired number of pixels, such as 8 million pixels or 12 million pixels.

The terminal 110A through 110D are connected to corresponding terminals on the bottom (lower) surface of the automatic focus part 101 in FIG. 1 and FIG. 2. The terminals 110A through 110D are elongated along the vertical directions in FIG. 2 inside the holder 104. The cut parts 111 are positioned in the middle of the terminals 110A through 110D to project from the exterior surface of the first wall parts 104A of the holder 104.

Figure 3A:
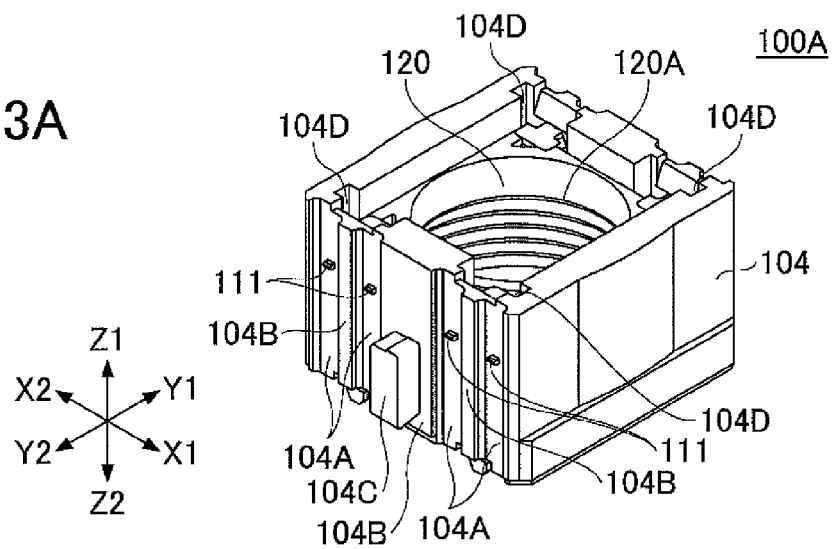
FIGS. 3A through 3C are diagrams illustrating a module including a holder and terminals according to an embodiment.
Figure 3B:
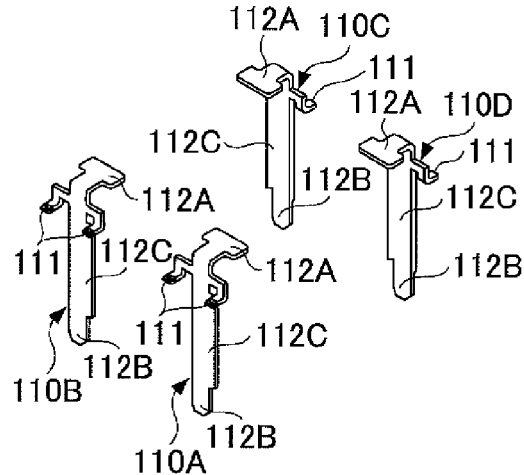
Figure 3C:
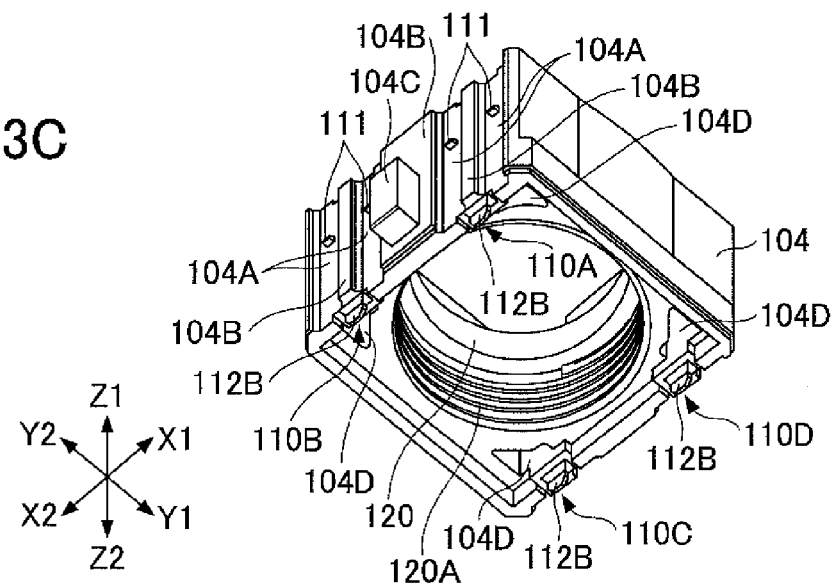

Next, a description is given, with reference to FIGS. 3A, 3B, and 3C, of the holder 104, the terminals 110A through 110D, the cut parts 111, and the through hole 120.

FIGS. 3A through 3C are diagrams illustrating a module 100A including the holder 104 and the terminals 110A through 110D according to an embodiment. FIG. 3A is a perspective view of the module 100A, illustrating its top side. FIG. 3B is a perspective view of the terminals 110A through 110D. FIG. 3C is a perspective view of the module 100A, illustrating its bottom side.

In FIGS. 3A through 3C, an X-axis, a Y-axis, and Z-axis that are defined by an X1 and an X2 direction, a Y1 and a Y2 direction, and a Z1 and a Z2 direction, respectively, are illustrated. The X1 direction and the X2 direction are opposite to each other on the X-axis, the Y1 direction and the Y2 direction are opposite to each other on the Y-axis, and the Z1 direction and the Z2 direction are opposite to each other on the Z-axis.

The module 100A illustrated in FIG. 3A is the same as the holder 104 to which the terminals 110A through 110D are attached as illustrated in the exploded perspective view of FIG. 2. The module 100A includes the holder 104 and the terminals 110A through 110D. The holder 104 and the terminals 110A through 110D are unitarily combined into the module 100A by insert molding.

FIG. 3B illustrates the terminals 110A through 110D in a non-molded state. The terminals 110A through 110D are held in the holder 104 by being subjected to insert molding using thermosetting resin. Therefore, the terminals 110A through 110D do not exist independently in the form illustrated in FIG. 3B in a molded state where the terminals 110A through 110D are combined with the holder 104.

In the following, the terminals 110A through 110D may be collectively referred to as "terminals 110" in the case of making no distinction among the terminals 110A through 110D.

Referring to FIG. 3A and FIG. 3C, the holder 104 includes the screw part 120A formed on the interior wall surface of the through hole 120 that penetrates through the holder 104 in the Z1 and the Z2 direction. The screw part 120A is configured to engage (mate) with the screw part 103C of the lens barrel 103.

An engagement part 104C is formed on the second wall part 104B on the Y2-side surface of the holder 104. The engagement part 104C serves to fix the camera module 100 to a board in the case of, for example, mounting the camera module 100 on the board.

Further, through holes 104C are formed in the holder 104 as illustrated in FIG. 3A and FIG. 3C. The through holes 104D are formed through the holder 104 in the Z1 and the Z2 direction beside the respective terminals 110A through 110D. The through holes 104D are formed by the insertion of part of a mold that holds the terminals 110A through 110D when manufacturing the holder 104 by insert molding.

Further, as illustrated in FIG. 3B, the terminals 110A through 110D have respective first and second opposite ends 112A and 112B, respective intermediate parts 112C, and the respective cut parts 111.

The first ends 112A are exposed at the top of the holder 104 in FIG. 3A, and are connected to corresponding terminals on the bottom surface of the automatic focus part 101.

The second ends 112B are on the opposite side from the first ends 112A, and project from the holder 104 at its lower end as illustrated in FIG. 3C.

The terminals 110A through 110D have the same structure. Accordingly, a description is given of the terminal 110A with respect to the details of the structure of the terminals 110A through 110D.

The first end 112A of the terminal 110A extends in the Z1 direction from the intermediate part 112C, and is bent in the Y1 direction by press working. The second end 112B of the terminal 110A extends straight in the Z2 direction from the intermediate part 112C.

The terminal 110A includes the cut part 111 that extends in the X1 and the X2 direction from the intermediate part 112C between the first end 112A and the second end 112B and then extends in the Y2 direction.

The terminal 110A is manufactured by performing press working on a hoop material. The terminal 110A is formed by being cut off of (separated from) a carrier for singulation after forming the holder 104 by insert molding. The cut part 111 is a mark of the cutting of the terminal 110A off of the carrier at the time of singulation.

Figure 4A:
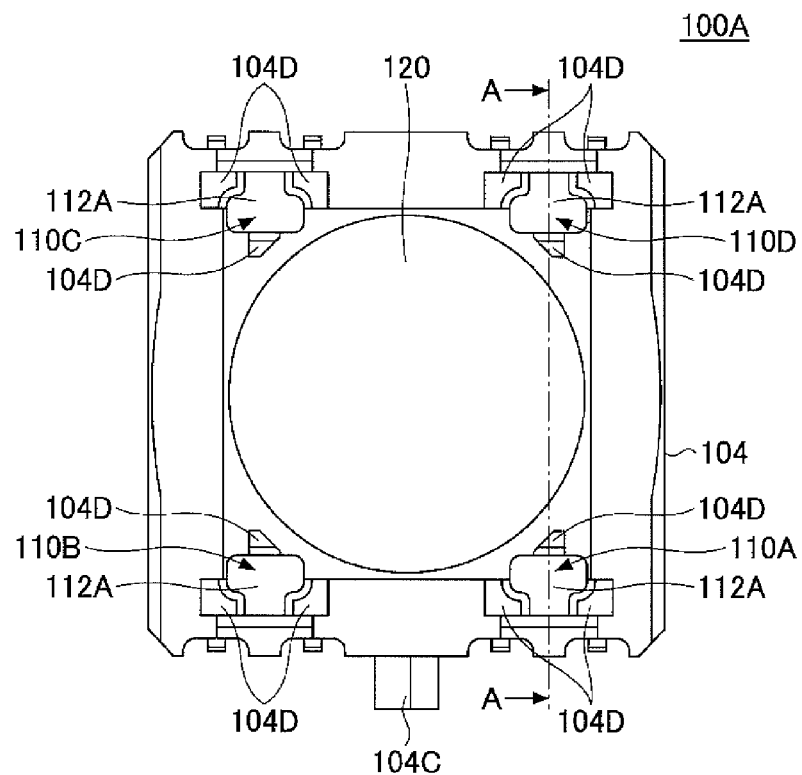
FIGS. 4A and 4B are plan view and a bottom view, respectively, of the module according to an embodiment.
Figure 4B:
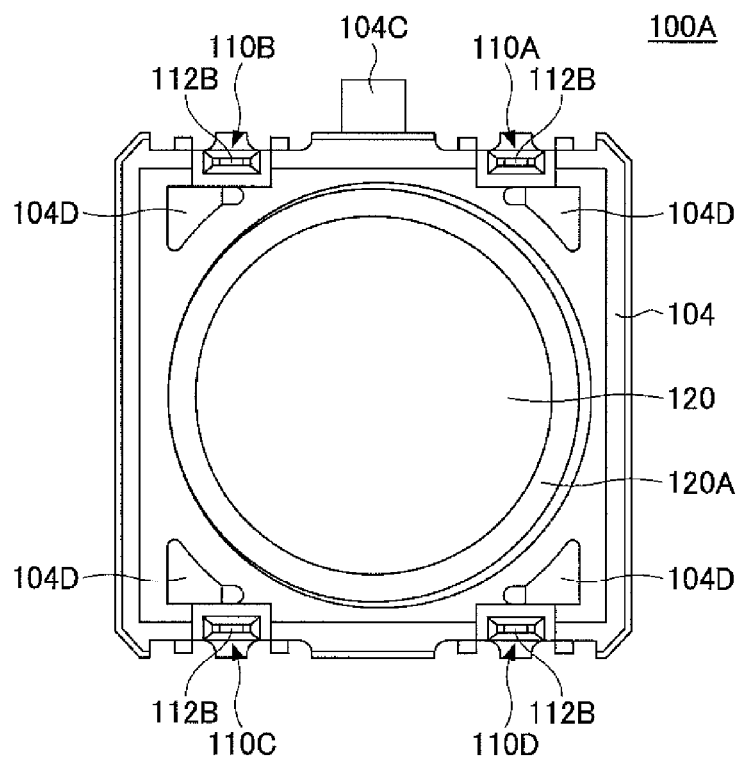

Next, a description is given, with reference to FIGS. 4A and 4B, of the planar structure of the top and the bottom of the module 100A into which the holder 104 and the terminals 110A and 110D are integrated.

FIGS. 4A and 4B are a (top) plan view and a bottom view, respectively, of the module 100A according to an embodiment.

Referring to FIG. 4A, the first ends 112A of the terminals 110A through 110D and the through hole 120 and the through holes 104D formed in the holder 104 are seen in the plan view. With respect to each of the terminals 110A through 110D, the corresponding through hole 104D branches off into three parts on the top surface side of the holder 104. The screw part 120A formed on the interior wall surface of the through hole 120 is not seen in the plan view.

Referring to FIG. 4B, the through hole 120, the screw part 102A, the second ends 112B of the terminals 110A through 110D, and the through holes 104D are seen in the bottom view. With respect to each of the terminals 110A through 110D, the corresponding through hole 104D forms a single (unbranched) opening on the bottom surface side of the holder 104.

Next, a description is given, with reference to FIGS. 5A and 5B, of a side surface structure and a cross-sectional structure of the module 100A.

FIGS. 5A and 5B are a side view and a cross-sectional view in a direction indicated by arrows A of FIG. 4A, taken along a one-dot chain line indicated by arrows A, respectively, of the module 100A according to an embodiment.

As illustrated in FIGS. 5A and 5B, the second ends 112B of the terminals 110A and 110B project (downward) relative to the bottom surface of the holder 104.

Further, as illustrated in FIG. 5B, the screw part 120A is formed on the interior wall surface of the through hole 120.

Figure 6A:
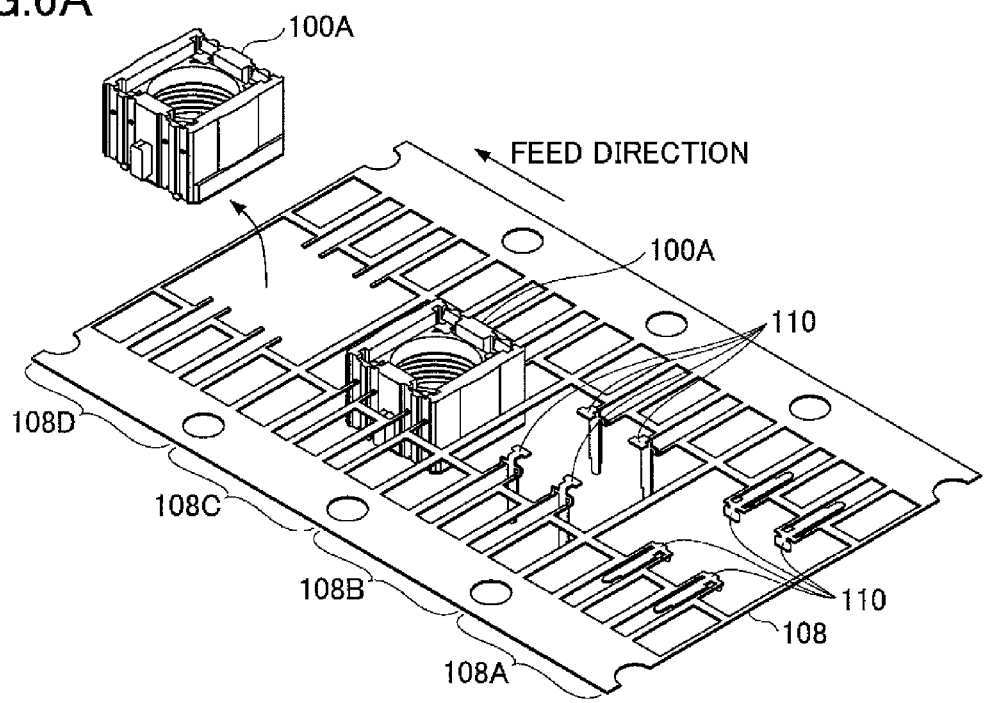
FIGS. 6A and 6B are diagrams illustrating a process for manufacturing the module of the camera module according to an embodiment.
Figure 6B:
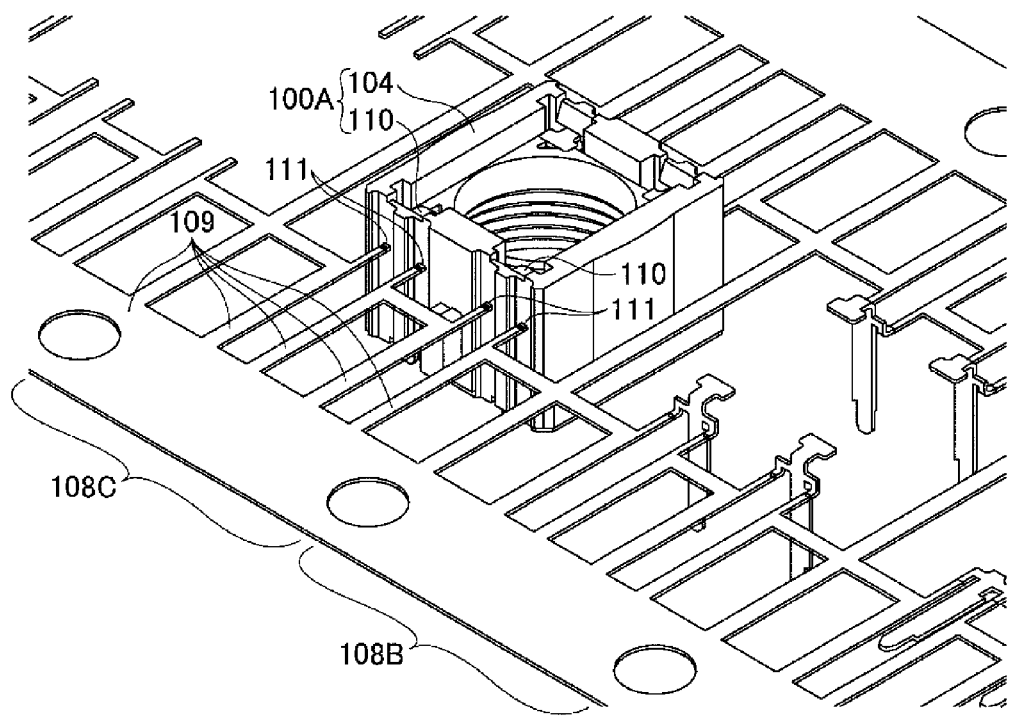

Next, a description is given, with reference to FIGS. 6A and 6B, of a method of manufacturing the module 100A of the camera module 100.

FIGS. 6A and 6B are diagrams illustrating a process for manufacturing the module 100A of the camera module 100 according to an embodiment. FIG. 6B is an enlarged view of part of FIG. 6A.

FIG. 6A illustrates a pressed plate 108. The pressed plate 108 is formed by, for example, subjecting a hoop material to press working. The feed direction in which the pressed plate 108 is fed, indicated by the arrow in FIG. 6A, corresponds to a lengthwise direction of the hoop material.

In the pressed plate 108 illustrated in FIG. 6A, four sets of terminals 110 for the camera module 100 (FIG. 1) are formed by press working.

Here, four regions that include respective sets of four terminals 110 of the pressed plate 108 illustrated in FIG. 6A are referred to as "regions 108A, 108B, 108C, and 108D." While FIG. 6A illustrates the four regions 108A through 108D, the number of regions may be more than four. In particular, a large number of regions are arranged in the case of forming the pressed plate 108 by processing a hoop material.

The regions 108A through 108D illustrated in FIG. 6A differ by one process (step) each.

In the region 108A, the four terminals 110A are punched out in a single region of the pressed plate 108 by press working, so that the first ends 112A, the second ends 112B, and the intermediate parts 112C (FIG. 3B) are formed.

In the region 108B, press working is performed to raise the intermediate parts 112C of the terminals 110 illustrated in the region 108A, so that the first ends 112A and the second ends 112B are raised.

In the region 108C, insert molding is performed on the terminals 110 illustrated in the region 108B, so that the holder 104 (unitarily combined with the terminals 100) is formed.

In this state, the module 100A is held by a carrier 109 of the pressed plate 108. Accordingly, by subjecting the module 100A in the region 108C shown enlarged in FIG. 6B to a singulation process for obtaining (cutting out) individual modules, the module 100A may be obtained from the pressed plate 108 as illustrated in the region 108D of FIG. 6A. The singulation process may be performed by, for example, cutting the carrier 109 that holds the modules 100A at a position near the holder 104 with a cutter or making a cut at a position near the holder 104 in the carrier 109 that holds the module 100A and cutting the carrier 109 by applying stress.

The cut parts 111 are portions of the terminals 110 that remain on the holder 104 as a result of cutting the carrier 109 of the pressed plate 108 at the time of performing singulation of the module 100A as illustrated in FIG. 6B. The cut parts 111 may be partially or entirely removed by, for example, grinding or the like.

Here, processes at different stages are illustrated in the regions 108A through 108D, respectively. Each of press working (see the regions 108A and 108B), insert molding (see the region 108C), and singulation (see the region 108D) may be performed in one region after another as illustrated in the regions 108A through 108D while feeding the pressed plate 108 in the feed direction indicated by the arrow in FIG. 6A after subjecting all of the terminals 110 formed in the regions 108A through 108D to press working at the same time.

Here, a description is given of the case where each of press working (see the regions 108A and 108B), insert molding (see the region 108C), and singulation (see the region 108D) is performed in one region after another as illustrated in the regions 108A through 108D while feeding the pressed plate 108 in the feed direction indicated by the arrow in FIG. 6A after subjecting all of the terminals 110 formed in the regions 108A through 108D to press working at the same time, while it is also possible to perform the same process (press working, insert molding, or singulation) in multiple regions in the feed direction.

FIG. 6A illustrates a state where the multiple regions 108A through 108D are aligned (arranged in a single line) in the pressed plate 108. Alternatively, press working may be performed so that regions are arranged in multiple lines in the feed direction. In this case, the same process (press working, insert molding, or singulation) may be performed in multiple regions arranged in a direction perpendicular to the feed direction.

Thus, according to the camera module 100 of one or more of the embodiments, the module 100A may be manufactured by forming the holder 104 by insert molding on the pressed plate 108 in which the multiple terminals 110 are formed by performing press working on a hoop material.

Thereafter, the lens 103A (the lens barrel 103) may be attached to the screw part 120A of the through hole 120 of the holder 104 of the module 100A, and then, the IR cut film 105 and the image sensor 106 (a camera part) may be attached to the holder 104 so that the light entrance surface of the image sensor 106 faces toward the lens 103A (see FIG. 2). Thus, the camera module 100 as illustrated in FIG. 1 is manufactured.

The conventional module for a camera module is manufactured by, for example, forming holes for terminals in a holder and inserting terminals into the respective holes. Unfortunately, according to such a module manufacturing method, the manufacturing cost increases because of an increase in the number of manufacturing processes due to the assembly of the holder and the terminals. Further, the increase in the manufacturing cost makes it difficult to lower the price of the camera module, thus causing an increase in the cost of the camera module. Thus, the manufacturing cost of the conventional camera module is high.

Further, there is also a problem in that the positioning accuracy of terminals is low.

In contrast, according to the camera module 100 of one or more of the embodiments, the module 100A is manufactured by forming the holder 104 by performing insert molding on the pressed plate 108 in which the multiple terminals 110 are formed by performing press working on a hoop material. Accordingly, it is possible to manufacture the module 100A very easily.

Therefore, using the module 100A makes it possible to reduce the manufacturing cost of the camera module 100 (FIG. 1), thus making it possible to make the camera module 100 less costly.

Thus, according to an aspect of the present invention, a camera module is provided that may be manufactured at low cost, and a method of manufacturing the camera module is provided.

Further, since the module 100A is manufactured by forming the holder 104 by performing insert molding on the pressed plate 108 in which the multiple terminals 110 are formed by performing press working on a hoop material, the positioning accuracy of the terminals 110 is high. The terminals 110, which are connected to the automatic focus part 101 via an electrically conductive adhesive agent or the like, the positioning accuracy of the terminals 110 greatly affect the reliability and the yield of the camera module 100.

Therefore, according to one or more of the embodiments, it is possible to provide the camera module 100 whose reliability and yield are greatly improved.

All examples and conditional language provided herein are intended for pedagogical purposes of aiding the reader in understanding the invention and the concepts contributed by the inventors to further the art, and are not to be construed as limitations to such specifically recited examples and conditions, nor does the organization of such examples in the specification relate to a showing of the superiority or inferiority of the invention. Although one or more embodiments of the present invention have been described in detail, it should be understood that the various changes, substitutions, and alterations could be made hereto without departing from the spirit and scope of the invention.

What is claimed is:

1. A camera module, comprising:
a plurality of terminals formed by performing press working on a metal plate;
a holder formed with the terminals by insert molding, wherein the holder holds the terminals, a through hole is formed through the holder in a direction in which the terminals extend, and a screw part is formed on a sidewall of the through hole;
a lens housed in the through hole by being screwed to the screw part; and
a camera part attached to the holder on a rear side of the lens.

2. The camera module as claimed in claim 1, wherein a wall part of the holder is depressed around cut parts of the terminals that project from an exterior surface of the wall part.

3. A method of manufacturing a camera module, comprising:
forming a pressed substrate including a plurality of sets of terminals by performing press working on a metal plate;
forming a holder by performing insert molding on each of the sets of the terminals so that the holder holds the terminals, wherein said forming the holder includes forming a through hole through the holder in a direction in which the terminals extend and forming a screw part on a sidewall of the through hole; and
performing singulation of the holder on a holder basis.

4. The method as claimed in claim 3, wherein
the metal plate is a hoop material, and
said forming the pressed substrate forms the sets of the terminals by performing the press working on the hoop material.

5. The method as claimed in claim 3, wherein said performing the singulation cuts the terminals off of a carrier of the pressed substrate at respective portions of the terminals that penetrate through a wall part of the holder and project from an exterior surface of the wall part.

6. A camera module, comprising:
a plurality of metal terminals;
a holder that is an insert-molded product including the terminals as inserts;
a lens screwed into a through hole formed through the holder; and
a camera part attached to the holder, wherein a light entrance surface of the camera part faces toward the lens.

7. The camera module as claimed in claim 6, wherein the holder is formed of a thermosetting resin and is unitarily combined with the terminals.

8. The camera module as claimed in claim 6, wherein
each of the terminals includes a portion that projects from an exterior surface of a wall part of the holder, and
the wall part of the holder is depressed around the portion of each of the terminals that projects from the exterior surface of the wall part.

* * * * *